United States Patent
Bibby, Jr. et al.

(10) Patent No.: US 6,361,646 B1
(45) Date of Patent: *Mar. 26, 2002

(54) METHOD AND APPARATUS FOR ENDPOINT DETECTION FOR CHEMICAL MECHANICAL POLISHING

(75) Inventors: Thomas Frederick Allen Bibby, Jr., Gilbert, AZ (US); John A. Adams, Escondido, CA (US); Robert A. Eaton, Scottsdale, AZ (US)

(73) Assignee: Speedfam-IPEC Corporation, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/271,729

(22) Filed: Mar. 18, 1999

Related U.S. Application Data

(63) Continuation-in-part of application No. 09/093,467, filed on Jun. 8, 1998.

(51) Int. Cl.[7] .................................................. C23F 1/04
(52) U.S. Cl. ........................... 156/345; 216/85; 216/88; 216/89; 216/90; 216/91; 438/7; 438/8; 438/14; 438/16; 438/690; 438/691; 438/692; 451/6
(58) Field of Search ................................ 216/85, 88–91; 438/7–9, 14, 16, 690–692; 451/282–287, 6; 356/355–358, 381; 156/345

(56) References Cited

U.S. PATENT DOCUMENTS

| | | | |
|---|---|---|---|
| 4,308,586 A | | 12/1981 | Coates |
| 4,317,698 A | * | 3/1982 | Christol et al. ................ 216/60 |
| 4,844,617 A | | 7/1989 | Kelderman et al. |
| 5,131,752 A | | 7/1992 | Yu et al. |
| 5,486,701 A | | 1/1996 | Norton et al. |

(List continued on next page.)

FOREIGN PATENT DOCUMENTS

| | | |
|---|---|---|
| EP | 0 881 040 A2 | 5/1998 |
| EP | 0 881 484 A2 | 5/1998 |
| WO | WO 95/18353 | 12/1993 |

OTHER PUBLICATIONS

Coppeta, J.R. and Rogers, C.B., "Mixing Measurements Using Laser Induced Fluorescence," AIAA, Paper No. 95–0167, 1995.

*Primary Examiner*—Jeffrie R. Lund
(74) *Attorney, Agent, or Firm*—Snell & Wilmer LLP

(57) ABSTRACT

An apparatus to generate an endpoint signal to control the polishing of thin films on a semiconductor wafer surface includes a through-hole in a polish pad, a light source, a fiber optic cable, a light sensor, and a computer. A pad assembly includes the polish pad, a pad backer, and a pad backing plate. The pad backer includes a pinhole and a canal that holds the fiber optic cable. The pad backer holds the polish pad so that the through-hole is coincident with the pinhole opening. A wafer chuck holds a semiconductor wafer so that the surface to be polished is against the polish pad. The light source provides light within a predetermined bandwidth. The fiber optic cable propagates the light through the through-hole opening to illuminate the surface as the pad assembly orbits and the chuck rotates. The light sensor receives reflected light from the surface through the fiber optic cable and generates reflected spectral data. The computer receives the reflected spectral data and calculates an endpoint signal. For metal film polishing, the endpoint signal is based upon the intensities of two individual wavelength bands. For dielectric film polishing, the endpoint signal is based upon fitting of the reflected spectrum to an optical reflectance model to determine remaining film thickness. The computer compares the endpoint signal to predetermined criteria and stops the polishing process when the endpoint signal meets the predetermined criteria.

12 Claims, 12 Drawing Sheets

U.S. PATENT DOCUMENTS

| | | |
|---|---|---|
| 5,517,312 A | 5/1996 | Finarov |
| 5,552,327 A | 9/1996 | Bachmann et al. |
| 5,609,511 A | 3/1997 | Moriyama et al. |
| 5,872,633 A * | 2/1999 | Holzapfel et al. .......... 356/381 |
| 5,893,796 A | 4/1999 | Birang et al. ............... 451/526 |
| 5,949,927 A | 9/1999 | Tang ........................... 385/12 |
| 5,953,578 A * | 9/1999 | Lee ............................... 438/9 |
| 6,106,662 A * | 8/2000 | Bibby et al. ................ 156/345 |
| 6,146,248 A | 11/2000 | Jairath et al. ................. 451/41 |
| 6,191,864 B1 * | 2/2001 | Sandhu ....................... 356/503 |

* cited by examiner

METHOD AND APPARATUS FOR ENDPOINT DETECTION FOR CHEMICAL MECHANICAL POLISHING

RELATED APPLICATIONS

This application is a continuation-in-part of U.S. patent application Ser. No. 09/093,467 entitled "Method and Apparatus for Endpoint Detection for Chemical Mechanical Polishing" filed Jun. 8, 1998.

FIELD OF THE INVENTION

The present invention relates to chemical mechanical polishing (CMP), and more particularly, to optical endpoint detection during a CMP process.

BACKGROUND INFORMATION

Chemical mechanical polishing (CMP) has emerged as a crucial semiconductor technology, particularly for devices with critical dimensions smaller than 0.5 micron. One important aspect of CMP is endpoint detection (EPD), i.e., determining during the polishing process when to terminate the polishing.

Many users prefer EPD systems that are "in situ EPD systems"which provide EPD during the polishing process. Numerous in situ EPD methods have been proposed, but few have been successfully demonstrated in a manufacturing environment and even fewer have proved sufficiently robust for routine production use.

One group of prior art in situ EPD techniques involves the electrical measurement of changes in the capacitance, the impedance, or the conductivity of the wafer and calculating the endpoint based on an analysis of this data. To date, these particular electrically based approaches to EPD are not commercially available.

One other electrical approach that has proved production worthy is to sense changes in the friction between the wafer being polished and the polish pad. Such measurements are done by sensing changes in the motor current. These systems use a global approach, i.e., the measured signal assesses the entire wafer surface. Thus, these systems do not obtain specific data about localized regions. Further, this method works best for EPD for metal CMP because of the dissimilar coefficient of friction between the polish pad and the tungsten-titanium nitride-titanium film stack versus the polish pad and the dielectric underneath the metal. However, with advanced interconnection conductors, such as copper (Cu), the associated barrier metals, e.g., tantalum or tantalum nitride, may have a coefficient of friction that is similar to the underlying dielectric. The motor current approach relies on detecting the copper-tantalum nitride transition, then adding an overpolish time. Intrinsic process variations in the thickness and composition of the remaining film stack layer mean that the final endpoint trigger time may be less precise than is desirable.

Another group of methods uses an acoustic approach. In a first acoustic approach, an acoustic transducer generates an acoustic signal that propagates through the surface layer(s) of the wafer being polished. Some reflection occurs at the interface between the layers, and a sensor positioned to detect the reflected signals can be used to determine the thickness of the topmost layer as it is polished. In a second acoustic approach, an acoustical sensor is used to detect the acoustical signals generated during CMP. Such signals have spectral and amplitude content that evolves during the course of the polish cycle. However, to date there has been no commercially available in situ endpoint detection system using acoustic methods to determine endpoint.

Finally, the present invention falls within the group of optical EPD systems. One approach for optical EPD systems is of the type disclosed in U.S. Pat. No. 5,433,651 to Lustig et al. in which a window in the platen of a rotating CMP tool is used to sense changes in a reflected optical signal. However, the window complicates the CMP process because it presents to the wafer an inhomogeneity in the polish pad. Such a region can also accumulate slurry and polish debris.

Another approach is of the type disclosed in European application EP 0 824 995 A1, which uses a transparent window in the actual polish pad itself. A similar approach for rotational polishers is of the type disclosed in European application EP 0 738 561 A1, in which a pad with an optical window is used for EPD. In both of these approaches, various means for implementing a transparent window in a pad are discussed, but making measurements without a window was not considered. The methods and apparatuses disclosed in these patents require sensors to indicate the presence of a wafer in the field of view. Furthermore, integration times for data acquisition are constrained to the amount of time the window in the pad is under the wafer.

In another type of approach, the carrier is positioned on the edge of the platen so as to expose a portion of the wafer. A fiber optic based apparatus is used to direct light at the surface of the wafer, and spectral reflectance methods are used to analyze the signal. The drawback of this approach is that the process must be interrupted in order to position the wafer in such a way as to allow the optical signal to be gathered.

In so doing, with the wafer positioned over the edge of the platen, the wafer is subjected to edge effects associated with the edge of the polish pad going across the wafer while the remaining portion of the wafer is completely exposed. An example of this type of approach is described in PCT application WO 98/05066.

In another approach, the wafer is lifted off of the pad a small amount, and a light beam is directed between the wafer and the slurry-coated pad. The light beam is incident at a small angle so that multiple reflections occur. The irregular topography on the wafer causes scattering, but if sufficient polishing is done prior to raising the carrier, then the wafer surface will be essentially flat and there will be very little scattering due to the topography on the wafer. An example of this type of approach is disclosed in U.S. Pat. No. 5,413,941. The difficulty with this type of approach is that the normal process cycle must be interrupted to make the measurement.

Yet another approach entails monitoring absorption of particular wavelengths in the infrared spectrum of a beam incident upon the backside of a wafer being polished so that the beam passes through the wafer from the nonpolished side of the wafer. Changes in the absorption within narrow, well defined spectral windows correspond to changing thickness of specific types of films. This approach has the disadvantage that, as multiple metal layers are added to the wafer, the sensitivity of the signal decreases rapidly. One example of this type of approach is disclosed in U.S. Pat. No. 5,643,046.

The above described prior art primarily deals with the apparatus used to gather the optical data. Another important aspect of endpoint detection is an effective means for analyzing and interpreting the reflected optical data that is gathered. The present invention provides a method for accurately analyzing reflectance data to determine when an endpoint has been reached.

SUMMARY OF THE INVENTION

An apparatus is provided for use with a tool for polishing thin films on a semiconductor wafer surface that detects an endpoint of a polishing process. In one embodiment, the apparatus includes a polish pad having a through-hole, a light source, a fiber optic cable assembly, a light sensor, and a computer. The light source provides light within a predetermined bandwidth. The fiber optic cable propagates the light through the through-hole to illuminate the wafer surface during the polishing process. The light sensor receives reflected light from the surface through the fiber optic cable and generates data corresponding to the spectrum of the reflected light. The computer receives the reflected spectral data and generates an endpoint signal as a function of the reflected spectral data. In the following description and discussion the term semiconductor wafer is meant to include all workpieces that are related to electronics, such as bare wafers with films, wafers partially or fully processed for forming integrated circuits and interconnecting lines, wafers partially or fully processed for forming micro-electromechanical devices (MEMS), specialized circuit assembly substrates, circuit boards, hybrid circuits, hard disk platters, flat panel display substrates, or other structures that would benefit from CMP with end point detection.

In a metal film polishing application, the endpoint signal is a function of the intensities of at least two individual wavelength bands selected from the predetermined bandwidth. In a dielectric film polishing application, the endpoint signal is based upon fitting of the reflected spectrum to an optical reflectance model to determine remaining film thickness. The computer compares the endpoint signal to predetermined criteria and stops the polishing process when the endpoint signal meets the predetermined criteria. Unlike prior art optical endpoint detection systems, an apparatus according to the present invention, together with the endpoint detection methodology, advantageously allows for accuracy and reliability in the presence of accumulated slurry and polishing debris. This robustness makes the apparatus suitable for in situ EPD in a production environment.

In an alternative embodiment, endpoint detection is accomplished by a comparison between a reference spectrum and the gathered reflectance spectrum. The reference spectrum is obtained by polishing a wafer to the process of record polish time and conditions while collecting the reflectance spectra vs. time from the wafer. A reflectance spectrum at a selected time just prior to the full polish time is then selected as the reference spectrum. One or more wafers may be used to establish the reference spectrum.

For wafers with a metal film to be polished, the reference time and corresponding reference spectrum are typically selected at a time that corresponds to stable polishing of the metal film before the onset of clearing of the metal film occurs. When clearing occurs, the reflected spectrum will be substantially different from the reference spectrum taken during the metal phase. In effect, for polishing of metal films, the method answers the question of when is the spectrum not like the metal reference spectrum. Since the metal film reflectance spectrum is quite similar from wafer to wafer, the reference spectrum may be taken from a reference wafer, or it may be taken each time a wafer is polished from the wafer itself, during the metal polishing phase before any clearing takes place.

Also please note that if it is desired to generate an endpoint on a barrier film between the metal film and a dielectric layer, the reference spectrum may be taken from the barrier layer with the appropriate reference wafer.

For dielectric film wafers, where the film reflectance changes during polishing, it is preferred to take a reference spectrum near the desired end point from a reference wafer. If it is desirable to know when, for example, half of the dielectric layer has been removed, a reference spectrum should be taken from the reference wafer that corresponds to half of the film being removed. The selection of the reference spectrum corresponds to the desired information from the film being polished.

Production wafers are then polished and the reflectance spectrum is continuously gathered. A comparison is made between the reference spectrum and the reflectance spectrum. In the case of polishing dielectric layers, when the difference between the reflectance spectrum and the reference spectrum is below a predetermined threshold, then the endpoint has been reached. In the case of polishing metal layers, when the difference between the reflectance spectrum and the reference spectrum is greater than a predetermined threshold, then the endpoint has been reached.

BRIEF DESCRIPTION OF THE DRAWINGS

The foregoing aspects and many of the attendant advantages of this invention will become more readily appreciated by reference to the following detailed description, when taken in conjunction with the accompanying drawings, wherein.

DETAILED DESCRIPTION

The present invention relates to a method of EPD using optical means and also to a method of processing the optical data. CMP machines typically include a means of holding a wafer or substrate to be polished. Such holding means are sometimes referred to as a carrier, but the holding means of the present invention is referred to herein as a "wafer chuck". CMP machines also typically include a polishing pad and a means to support the pad. Such pad support means are sometimes referred to as a polishing table or platen, but the pad support means of the present invention is referred to herein as a "pad backer". Slurry is required for polishing and is delivered either directly to the surface of the pad or through holes and grooves in the pad directly to the surface of the wafer. The control system on the CMP machine causes the surface of the wafer to be pressed against the pad surface with a prescribed amount of force. The motion of the wafer is arbitrary, but is rotational about its center around an axis perpendicular to the plane of the wafer in a preferred embodiment.

Further, as will be described below, the motion of the polishing pad is preferably nonrotational to enable a short length of fiber optic cable to be inserted into the pad without breaking. Instead of being rotational, the motion of the pad is "orbital" in a preferred embodiment. In other words, each point on the pad undergoes circular motion about its individual axis, which is parallel to the wafer chuck's axis. In a preferred embodiment, the orbit diameter is 1.25 inches. Further, it is to be understood that other elements of the CMP tool not specifically shown or described may take various forms known to persons of ordinary skill in the art. For example, the present invention can be adapted for use in the CMP tool disclosed in U.S. Pat. No. 5,554,064, which is incorporated herein by reference.

Apparatus Description

Figure 1:
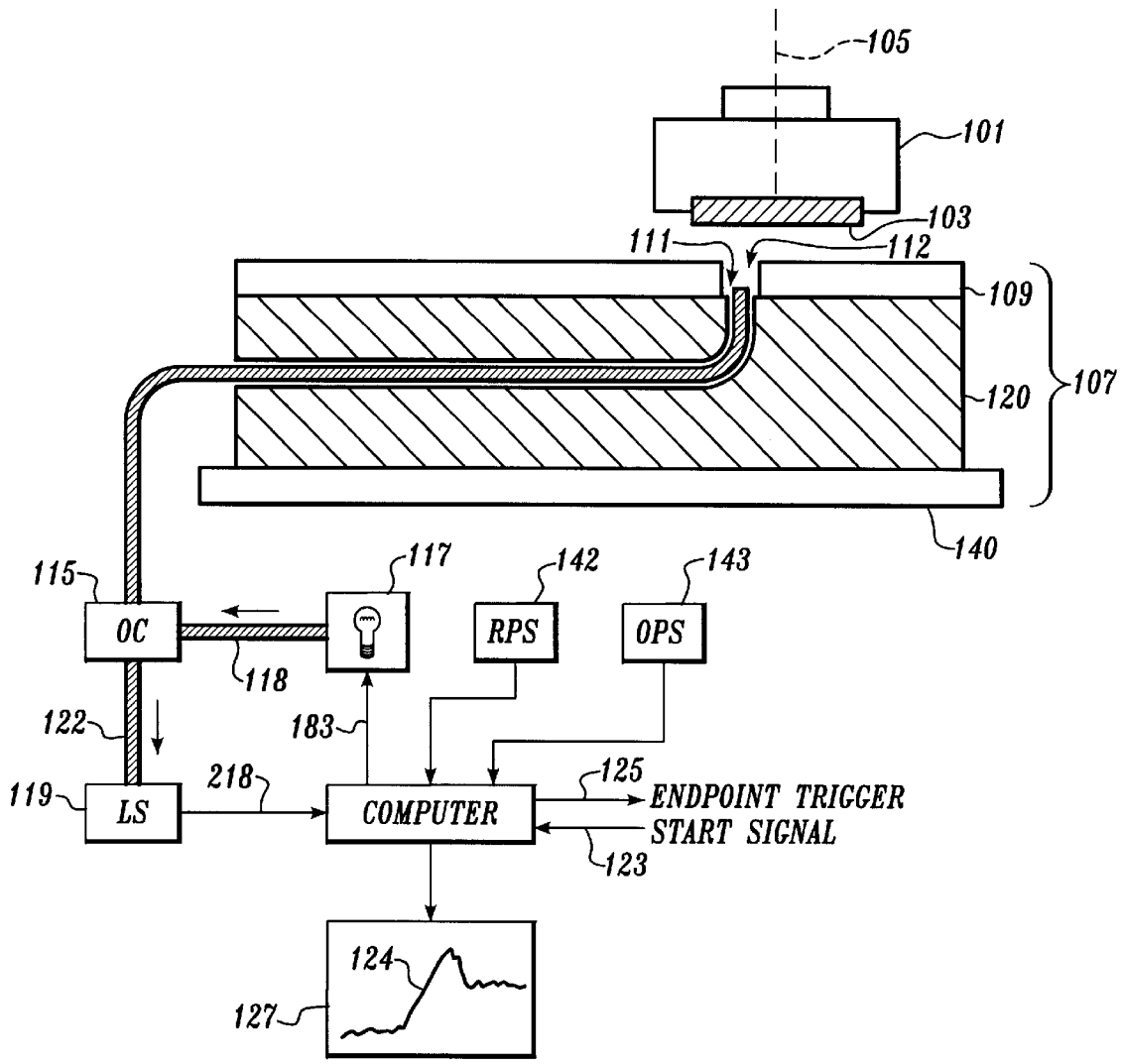
FIG. 1 is a schematic illustration of an apparatus formed in accordance with the present invention.

A schematic representation of the overall system of the present invention is shown in FIG. 1. As seen, a wafer chuck 101 holds a wafer 103 that is to be polished. The wafer chuck 101 preferably rotates about its vertical axis 105. A pad assembly 107 includes a polishing pad 109 mounted onto a pad backer 120. The pad backer 120 is in turn mounted onto a pad backing plate 140. In a preferred embodiment, the pad backer 120 is composed of urethane and the pad backing plate 140 is stainless steel. Other embodiments may use other suitable materials for the pad backer and pad backing. Further, the pad backing plate 140 is secured to a driver or motor means (not shown) that is operative to move the pad assembly 107 in the preferred orbital motion.

Polishing pad 109 includes a through-hole 112 that is coincident and communicates with a pinhole opening 111 in the pad backer 120. Further, a canal 104 is formed in the side of the pad backer 120 adjacent the backing plate. The canal 104 leads from the exterior side 110 of the pad backer 120 to the pinhole opening 111. In a preferred embodiment, a fiber optic cable assembly including a fiber optic cable 113 is inserted in the pad backer 120 of pad assembly 107, with one end of fiber optic cable 113 extending through the top surface of pad backer 120 and partially into through-hole 112. Fiber optic cable 113 can be embedded in pad backer 120 so as to form a watertight seal with the pad backer 120, but a watertight seal is not necessary to practice the invention. Further, in contrast to conventional systems as exemplified by U.S. Pat. No. 5,433,651 to Lustig et al. that use a platen with a window of quartz or urethane, the present invention does not include such a window. Rather, the pinhole opening 111 is merely an orifice in the pad backer in which fiber optic cable 113 may be placed. Thus, in the present invention, the fiber optic cable 113 is not sealed to the pad backer 120. Moreover, because of the use of a pinhole opening 111, the fiber optic cable 113 may even be placed within one of the existing holes in the pad backer and polishing pad used for the delivery of slurry without adversely affecting the CMP process. As an additional difference, the polishing pad 109 has a simple through-hole 112.

Fiber optic cable 113 leads to an optical coupler 115 that receives light from a light source 117 via a fiber optic cable 118. The optical coupler 115 also outputs a reflected light signal to a light sensor 119 via fiber optic cable 122. The reflected light signal is generated in accordance with the present invention, as described below.

A computer 121 provides a control signal 183 to light source 117 that directs the emission of light from the light source 117. The light source 117 is a broadband light source, preferably with a spectrum of light between 200 and 1000 nm in wavelength, and more preferably with a spectrum of light between 400 and 900 nm in wavelength. A tungsten bulb is suitable for use as the light source 117. Computer 121 also receives a start signal 123 that will activate the light source 117 and the EPD methodology. The computer also provides an endpoint trigger 125 when, through the analysis of the present invention, it is determined that the endpoint of the polishing has been reached.

Orbital position sensor 143 provides the orbital position of the pad assembly while the wafer chuck's rotary position sensor 142 provides the angular position of the wafer chuck to the computer 121, respectively. Computer 121 can synchronize the trigger of the data collection to the positional information from the sensors. The orbital sensor identifies which radius the data is coming from and the combination of the orbital sensor and the rotary sensor determine which point.

In operation, soon after the CMP process has begun, the start signal 123 is provided to the computer 121 to initiate the monitoring process. Computer 121 then directs light source 117 to transmit light from light source 117 via fiber optic cable 118 to optical coupler 115. This light in turn is routed through fiber optic cable 113 to be incident on the surface of the wafer 103 through pinhole opening 111 and the through-hole 112 in the polishing pad 109.

Reflected light from the surface of the wafer 103 is captured by the fiber optic cable 113 and routed back to the optical coupler 115. Although in the preferred embodiment the reflected light is relayed using the fiber optic cable 113, it will be appreciated that a separate dedicated fiber optic cable (not shown) may be used to collect the reflected light. The return fiber optic cable would then preferably share the canal 104 with the fiber optic cable 113 in a single fiber optic cable assembly.

The optical coupler 115 relays this reflected light signal through fiber optic cable 122 to light sensor 119. Light sensor 119 is operative to provide reflected spectral data 218, referred to herein as the reflected spectral data 218, of the reflected light to computer 121.

One advantage provided by the optical coupler 115 is that rapid replacement of the pad assembly 107 is possible while retaining the capability of endpoint detection on subsequent wafers. In other words, the fiber optic cable 113 may simply be detached from the optical coupler 115 and a new pad assembly 107 may be installed (complete with a new fiber optic cable 113). For example, this feature is advantageously utilized in replacing used polishing pads in the polisher. A spare pad backer assembly having a fresh polishing pad is used to replace the pad backer assembly in the polisher. The used polishing pad from the removed pad backer assembly is then replaced with a fresh polishing pad for subsequent use.

After a specified or predetermined integration time by the light sensor 119, the reflected spectral data 218 is read out of the detector array and transmitted to the computer 121, which analyzes the reflected spectral data 218. The integration time typically ranges from 5 to 150 ms, with the integration time being 15 ms in a preferred embodiment. One result of the analysis by computer 121 is an endpoint signal 124 that is displayed on monitor 127. Preferably, computer 121 automatically compares endpoint signal 124 to predetermined criteria and outputs an endpoint trigger 125 as a function of this comparison. Alternatively, an operator can monitor the endpoint signal 124 and select an endpoint based on the operator's interpretation of the endpoint signal 124. The endpoint trigger 125 causes the CMP machine to advance to the next process step.

Figure 2:
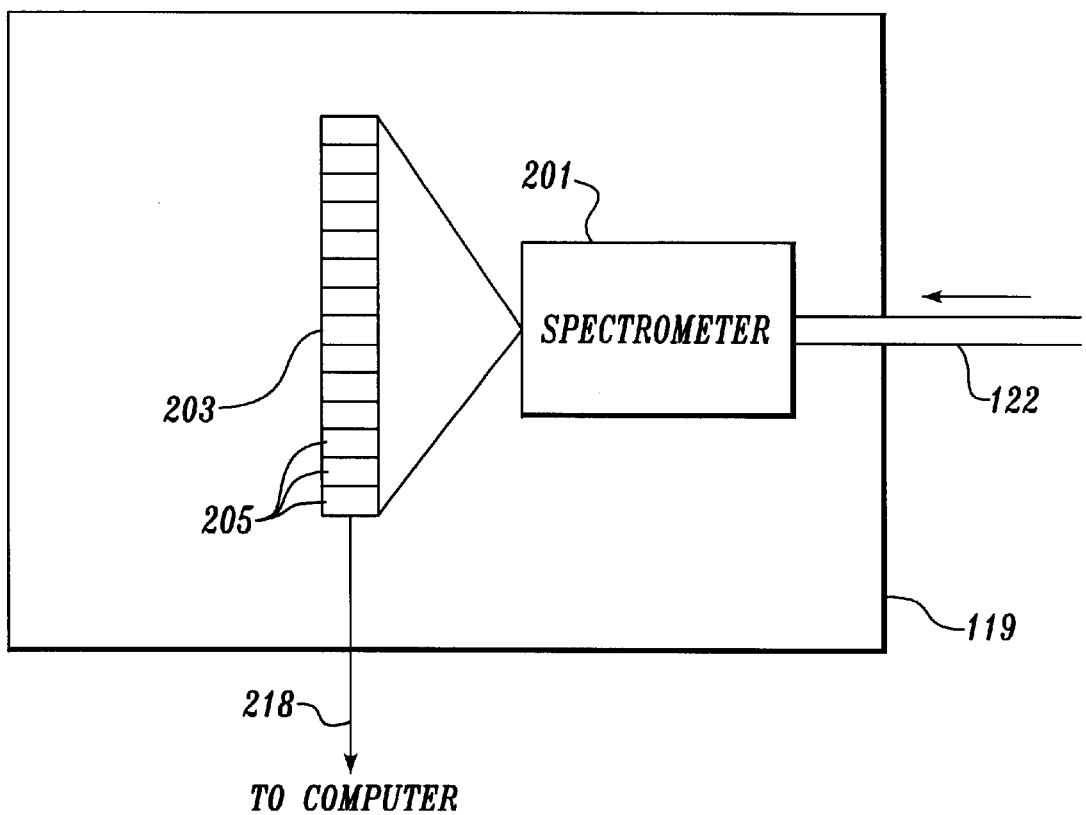
FIG. 2 is a schematic diagram of a light sensor for use in the apparatus of FIG. 1.
Figure 2A:
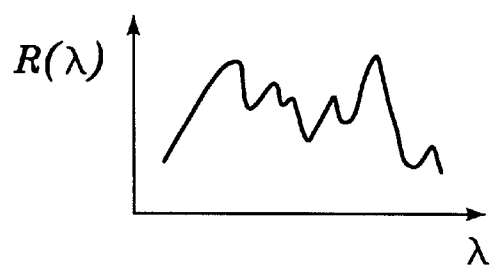
FIG. 2A is a diagram illustrating reflected spectral data.

Turning to FIG. 2, the light sensor 119 contains a spectrometer 201 that disperses the light according to wavelength onto a detector array 203 that includes a plurality of light-sensitive elements 205. The spectrometer 201 uses a grating to spectrally separate the reflected light. The reflected light incident upon the light-sensitive elements 205 generates a signal in each light-sensitive element (or "pixel") that is proportional to the intensity of light in the narrow wavelength region incident upon said pixel. The magnitude of the signal is also proportional to the integration time. Following the integration time, reflected spectral data 218 indicative of the spectral distribution of the reflected light is output to computer 121 as illustrated in FIG. 2A.

In light of this disclosure, it will be appreciated that, by varying the number of pixels 205, the resolution of the reflected spectral data 218 may be varied. For example, if the light source 117 has a total bandwidth of between 200 to 1000 nm, and if there are 980 pixels 205, then each pixel 205 provides a signal indicative of a wavelength band spanning 10 nm (9800 nm divided by 980 pixels). By increasing the number of pixels 205, the width of each wavelength band sensed by each pixel may be proportionally narrowed. In a preferred embodiment, detector array 203 contains 512 pixels 205.

Figure 3:
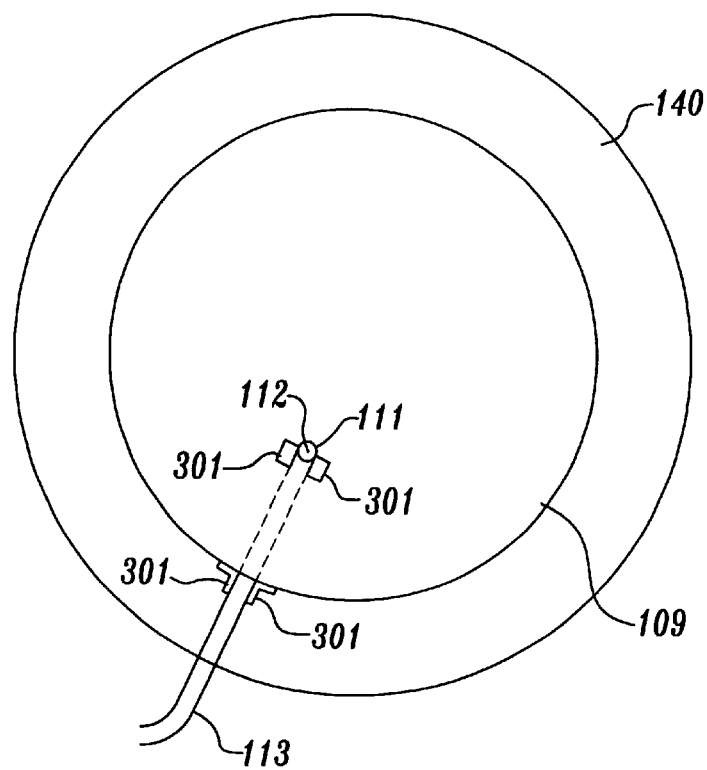
FIG. 3 is a top view of the pad assembly for use in the apparatus of FIG. 1.

FIG. 3 shows a top view of the pad assembly 107. The pad backing plate 140 has a pad backer 120 (not shown in FIG. 3) secured to its top surface. Atop the pad backer 120 is secured the polishing pad 109. Pinhole opening 111 and through-hole 112 are shown near a point in the middle of the polishing pad 109, though any point in the polishing pad 109 can be used. The fiber optic cable 113 extends through the body of the pad backer 120 and emerges in pinhole opening 111. Further, clamping mechanisms 301 are used to hold the fiber optic cable 113 in fixed relation to the pad assembly 107. Clamping mechanisms do not extend beyond the plane of interface between the pad backer 120 and the polishing pad 120.

Figure 4:
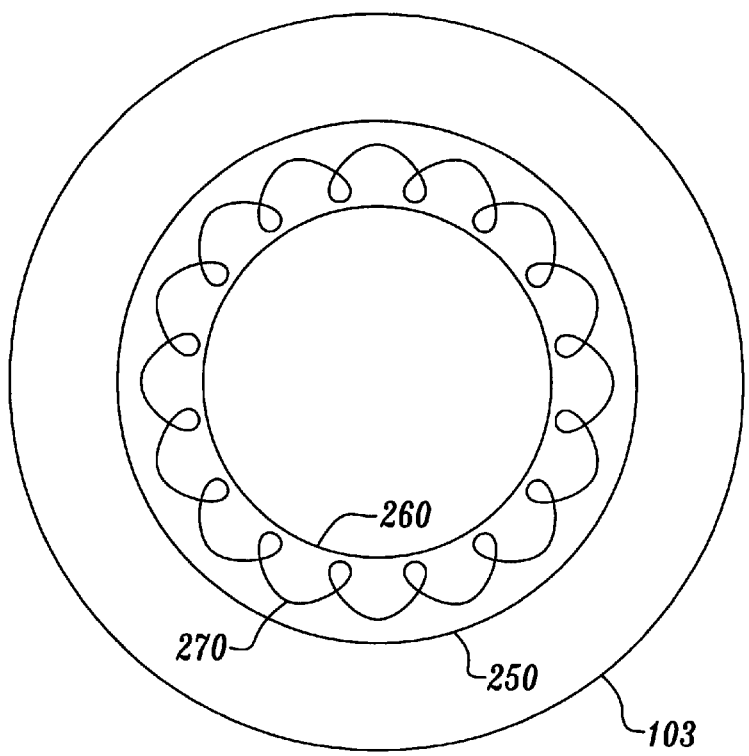
FIG. 4 illustrates an example trajectory for a given point on the pad showing the annular region that is traversed on the wafer when the wafer rotates and the pad orbits.

With a rotating wafer chuck 101 and an orbiting pad assembly 107, any given point on the polishing pad 109 will follow spirographic trajectories, with the entire trajectory lying inside an annulus centered about the center of the wafer. An example of such trajectory is shown in FIG. 4. The wafer 103 rotates about its center axis 105 while the polish pad 109 orbits. Shown in FIG. 4 is an annulus with an outer limit 250, an inner limit 260, and an example trajectory 270. In the example shown, the platen orbit speed is 16 times the wafer chuck 101 rotation speed, but such a ratio is not critical to the operation of the EPD system described here.

In a preferred embodiment of the present invention, the location of the orbital motion of through-hole 112 is contained entirely within the area circumscribed by the perimeter of the wafer 103. In other words, the outer limit 250 is equal to or less than the radius of wafer 103. As a result, the wafer 103 is illuminated continuously, and reflectance data can be sampled continuously. In this embodiment, an endpoint signal is generated at least once per second, with a preferred integration time of light sensor 119 (FIG. 1) being 15 ms. When properly synchronized, any particular point within the sample annulus can be detected repeatedly. Furthermore, by sampling twice during the orbit cycle of the pad, at the farthest point in the orbit from the wafer center and the nearest point, the reflectance at the inner and outer radii can be detected. Thus, with a single sensor one can measure uniformity at two radial points. For stable production processes, measuring uniformity at two radial points can be sufficient for assuring that a deviation from a stable process is detected when the deviation occurs.

Orbital position sensor 143 provides the orbital position of the pad assembly while the wafer chuck's rotary position sensor 142 provides the angular position of the wafer chuck to the computer 121, respectively. The computer 121 can then synchronize the trigger of the data collection to the positional information from these sensors. The orbital sensor identifies which radius the data are coming from and the combination of the orbital sensor and the rotary sensor determine which point. Using this synchronization method, any particular point within the sample annulus can be detected repeatedly.

With additional sensors in the pad backer 120 and polishing pad 109, each sampled with proper synchronous triggering, any desired measurement pattern can be obtained, such as radial scans, diameter scans, multipoint polar maps, 52-site Cartesian maps, or any other calculable pattern. These patterns can be used to assess the quality of the polishing process. For example, one of the standard CMP measurements of quality is the standard deviation of the thicknesses of the material removed, divided by the mean of thicknesses of the material removed, measured over the number of sample sites. If the sampling within any of the annuli is done randomly or asynchronously, the entire annulus can be sampled, thus allowing measurements around the wafer. Although in this embodiment the capability of sensing the entire wafer is achieved by adding more sensors, alternate approaches can be used to obtain the same result.

For example, enlarging the orbit of the pad assembly increases the area a single sensor can cover. If the orbit diameter is one-half of the wafer radius, the entire wafer will be scanned, provided that the inner limit of the annulus coincides with the wafer center. In addition, the fiber optic end may be translated within a canal 104 to stop at multiple positions by means of another moving assembly. In light of this disclosure, one of ordinary skill in the art can implement alternative approaches that achieve the same result without undue experimentation.

Data Analysis Description

Simply collecting the reflected spectral data 218 is generally insufficient to allow the EPD system to be robust, since the amplitude of the signal fluctuates considerably, even when polishing uniform films. The present invention further provides methods for analyzing the spectral data to process EPD information to more accurately detect the endpoint.

The amplitude of the reflected spectral data 218 collected during CMP can vary by as much as an order of magnitude, thus adding "noise" to the signal and complicating analysis. The amplitude "noise" can vary due to: the amount of slurry between the wafer and the end of the fiber optic cable; the variation in distance between the end of the fiber optic cable and the wafer (e.g., this distance variation can be caused by pad wear or vibration); changes in the composition of the slurry as it is consumed in the process; changes in surface roughness of the wafer as it undergoes polishing; and other physical and/or electronic sources of noise.

Figure 5A:
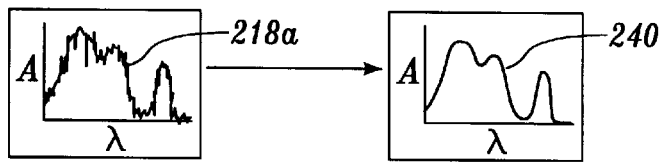
FIGS. 5A–5F are diagrams illustrating the effects of applying various noise-reducing methodologies to the reflected spectral data, in accordance with the present invention.

Several signal processing techniques can be used for reducing the noise in the reflected spectral data 218a–218f, as shown in FIGS. 5A–5F. For example, a technique of single-spectrum wavelength averaging can be used as illustrated in FIG. 5A. In this technique, the amplitudes of a given number of pixels within the single spectrum and centered about a central pixel are combined mathematically to produce a wavelength-smoothed data spectrum 240. For example, the data may be combined by simple average, boxcar average, median filter, gaussian filter, or other standard mathematical means when calculated pixel by pixel over the reflected spectral data 218a. The smoothed spectrum 240 is shown in FIG. 5A as a plot of amplitude vs. wavelength.

Figure 5B:
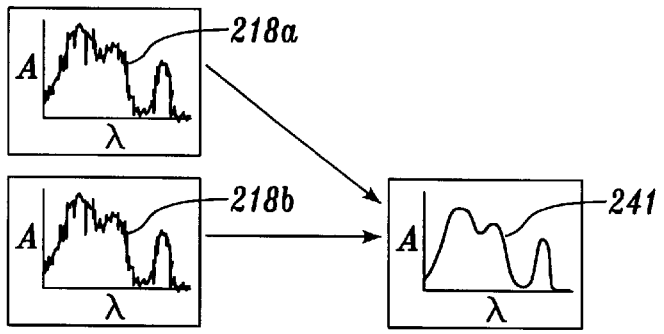

Alternatively, a time-averaging technique may be used on the spectral data from two or more scans (such as the reflected spectral data 218a and 218b representing data taken at two different times) as illustrated in FIGURE 5B. In this technique, the spectral data of the scans are combined by averaging the corresponding pixels from each spectrum, resulting in a smoother spectrum 241.

Figure 5C:
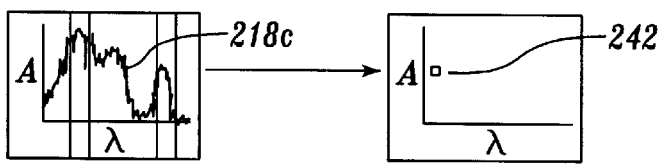

In another technique illustrated in FIG. 5C, the amplitude ratio of wavelength bands of reflected spectral data 218c are calculated using at least two separate bands consisting of one or more pixels. In particular, the average amplitude in each band is computed and then the ratio of the two bands is calculated. The bands are identified for reflected spectral data 218g in FIG. 5C as 520 and 530, respectively. This technique tends to automatically reduce amplitude variation effects since the amplitude of each band is generally affected in the same way while the ratio of the amplitudes in the bands removes the variation. This amplitude ratio results in the single data point 242 on the ratio vs. time plot of FIG. 5C.

Figure 5D:
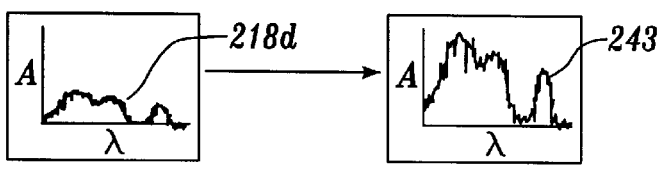
Figure 5E:
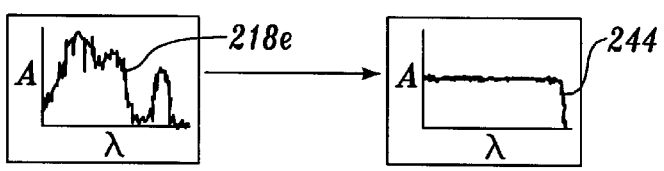

FIG. 5D illustrates a technique that can be used for amplitude compensation while polishing metal layers on a semiconductor wafer. For metal layers formed from tungsten (W), aluminum (Al), copper (Cu), or other metal, it is known that, after a short delay of 10 to 60 seconds after the initial startup of the CMP metal process, the reflected spectral data 218d are substantially constant. Any changes in the reflected spectral data 218d amplitude would be due to noise as described above. After the short delay, to compensate for amplitude variation noise, several sequential scans (e.g., 5 to 10 in a preferred embodiment) are averaged to produce a reference spectral data signal, in an identical way that spectrum 241 was generated. Furthermore, the amplitude of each pixel is summed for the reference spectral signal to determine a reference amplitude for the entire 512 pixels present.

Each subsequent reflected spectral data scan is then "normalized" by (i) summing up all of the pixels for the entire 512 pixels present to obtain the sample amplitude, and then (ii) multiplying each pixel of the reflected spectral data by the ratio of the reference amplitude to the sample amplitude to calculate the amplitude-compensated spectra 243.

Figure 5F:
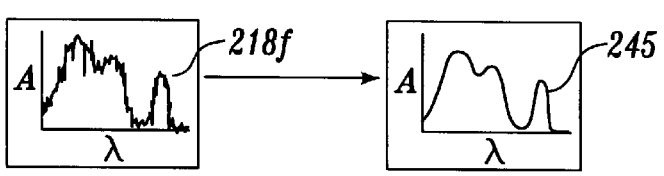

In addition to the amplitude variation, the reflected spectral data, in general, also contain the instrument function response. For example, the spectral illumination of the light source 117 (FIG. 1), the absorption characteristics of the various fiber optics and the coupler, and the inherent interference effects within the fiber optic cables, all undesirably appear in the signal. As illustrated in FIG. 5F, it is possible to remove this instrument function response by normalizing the reflected spectral data 218f by dividing the reflected spectral data 218f by the reflected signal obtained when a "standard" reflector is placed on the pad 109 (FIG. 1). The "standard" reflector is typically a first surface of a highly reflective plate (e.g., a metallized plate or a partially polished metallized semiconductor wafer). The instrument-normalized spectrum 244 is shown as a relatively flat line with some noise still present.

In view of the present disclosure, one of ordinary skill in the art may employ other means, to process reflected spectral data 218f to obtain the smooth data result shown as spectra 245. For example, the aforementioned techniques of amplitude compensation, instrument function normalization, spectral wavelength averaging, time averaging, amplitude ratio determination, or other noise reduction techniques known to one of ordinary skill in the art, can be used individually or in combination to produce a smooth signal.

It is possible to use the amplitude ratio of wavelength bands to generate an endpoint signal 124 directly. Further processing on a spectra-by-spectra basis may be required in some cases. For example, this further processing may include determining the standard deviation of the amplitude ratio of the wavelength bands, further time averaging of the amplitude ratio to smooth out noise, or other noise-reducing signal processing techniques that are known to one of ordinary skill in the art.

Figure 5G:
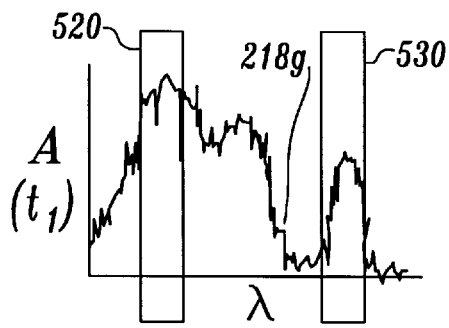
FIGS. 5G–5K are diagrams illustrating the formation of one endpoint signal (EPS) from the spectral data of the reflected light signal and show transition points in the polishing process, in accordance with one embodiment of the present invention.
Figure 5H:
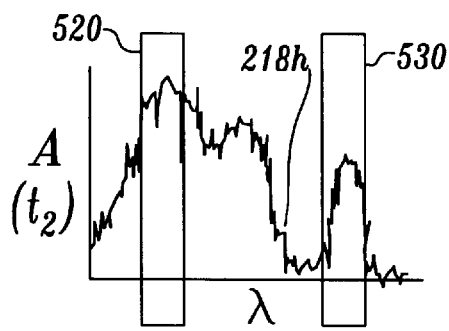
Figure 5I:
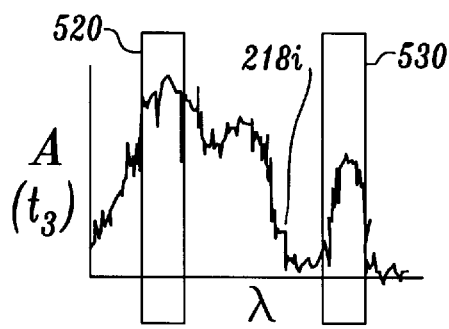
Figure 5J:
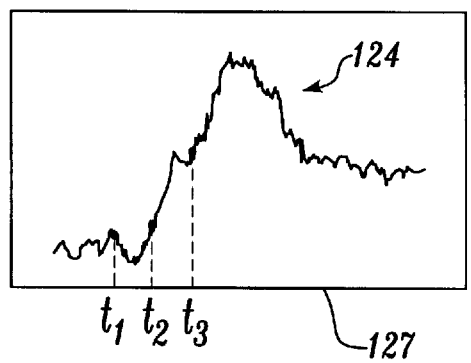
Figure 5K:
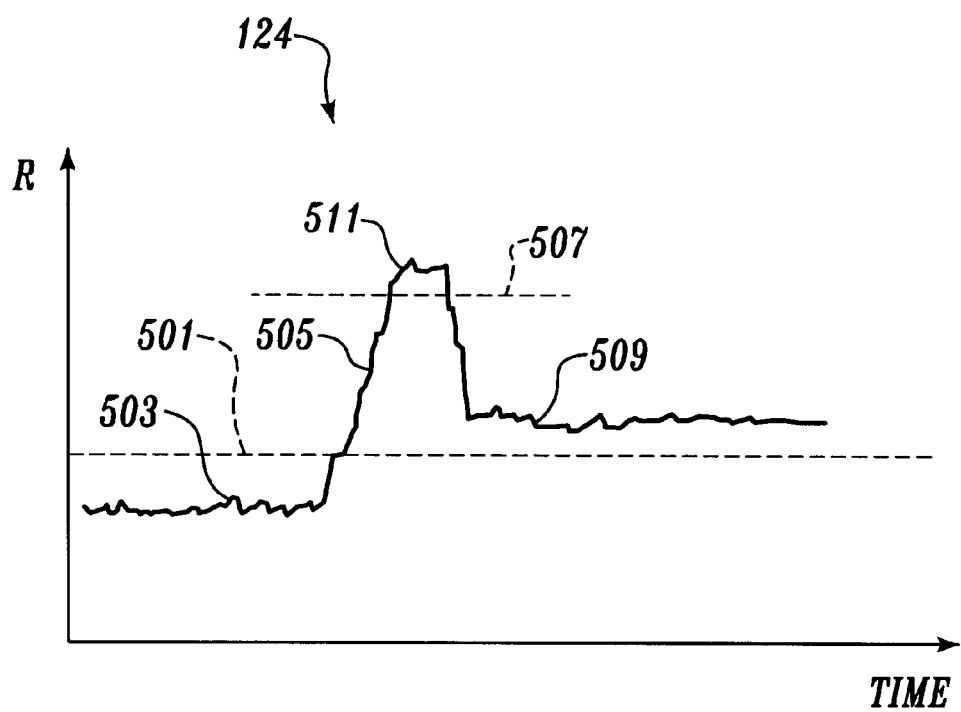

FIGS. 5G–5J illustrate the endpoint signal 124 generated by applying the amplitude ratio of wavelength bands technique described in conjunction with FIG. 5C to the sequential reflected spectral data 218g, 218h, and 218i during the polishing of a metallized semiconductor wafer having metal over a barrier layer and a dielectric layer. The wavelength bands 520 and 530 were selected by looking for particularly strong reflectance values in the spectral range. This averaging process provides additional noise reduction. Moreover, it was found that the amplitude ratio of wavelength bands changed as the material exposed to the slurry and polish pad changed. Plotting the ratio of reflectance at these specific wavelengths versus time shows distinct regions that correspond to the various layers being polished. Of course, the points corresponding to FIGS. 5G–5I are only three points of the plot, as illustrated in FIG. 5J. In practice, as illustrated in FIG. 5K, the transition above a threshold value 501 indicates the transition from a bulk metal layer 503 to the barrier layer 505, and the subsequent lowering of the level below threshold 507 after the peak 511 indicates the transition to the dielectric layer 509. Wavelength bands 520 and 530 are selected from the bands 450 to 475 nm, 525 to 550 nm, or 625 to 650 nm in preferred embodiments for polishing tungsten (W), titanium nitride (TiN), or titanium (Ti) films formed on silicon dioxide ($SiO_2$). As described previously, these wavelength bands can be different for different materials and different CMP processes, and typically would be determined empirically.

In the present invention, integration times may be increased to cover larger areas of the wafer with each scan. In addition, any portion of the wafer within the annulus of a sensor trajectory can be sensed, and with a plurality of sensors or other techniques previously discussed, the entire wafer can be measured.

Figure 6:
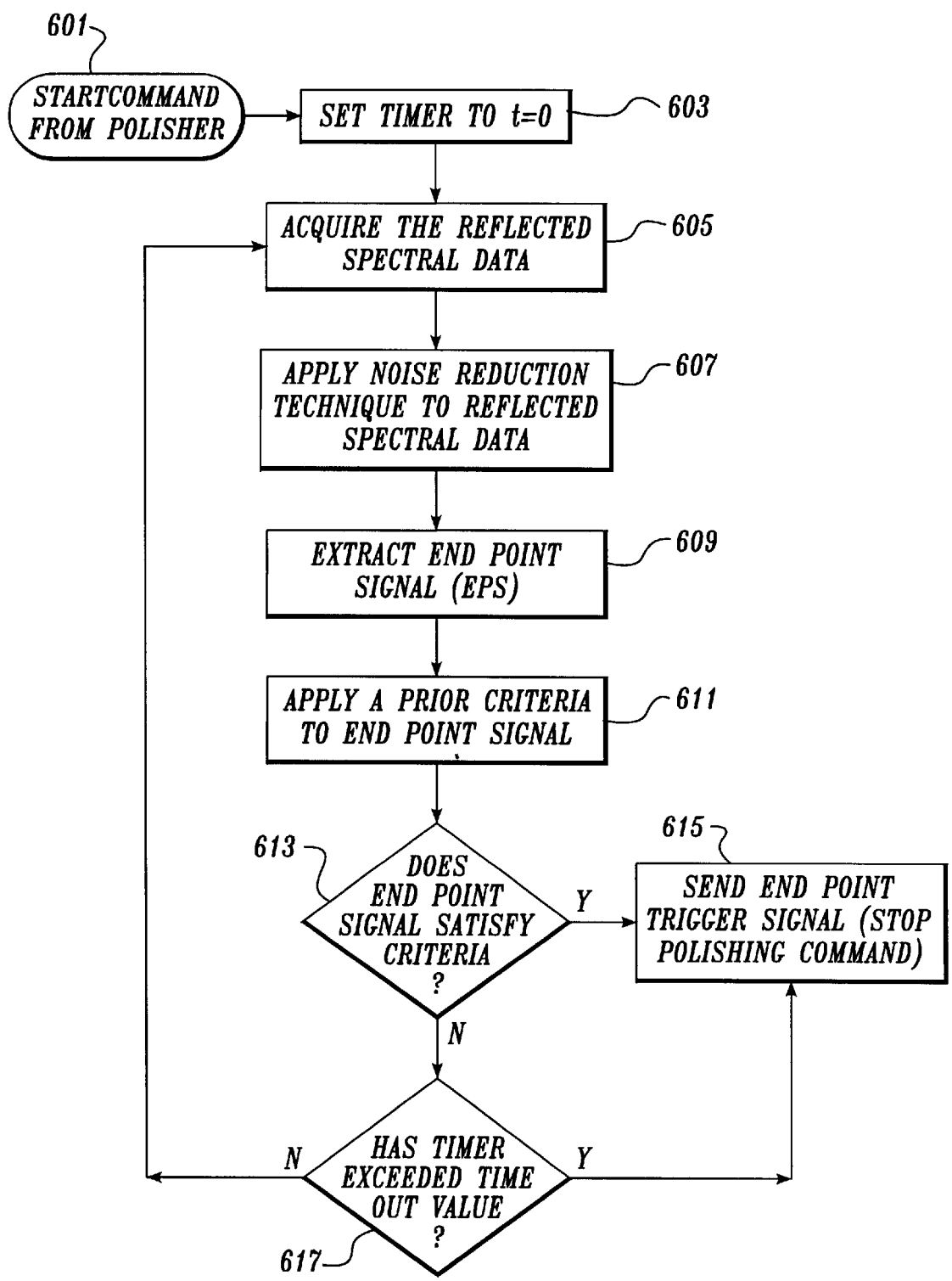
FIG. 6 is a flow diagram illustrating the analysis of the reflectance signal in accordance with the present invention.

For a metal polish process, the specific method of determining the plot of FIG. 5 is illustrated in the flow diagram of FIG. 6. The process of FIG. 6 is implemented by computer 121 properly programmed to carry out the process of FIG. 6. First, at a box 601, a start command is received from the CMP apparatus. After the start command has been received, at box 603, a timer is set to zero. The timer is used to measure the amount of time required from the start of the CMP process until the endpoint of the CMP process has been detected. This timer is advantageously used to provide a fail-safe endpoint method. If a proper endpoint signal is not detected by a certain time, the endpoint system issues a stop polishing command based solely on total polish time. In effect, if the timeout is set properly, no wafer will be overpolished and thereby damaged. However, some wafers may be underpolished and have to undergo a touchup polish if the endpoint system fails, but these wafers will not be damaged. The timer can also be advantageously used to determine total polish time so that statistical process control data may be accumulated and subsequently analyzed.

Next, at box 605, the computer 121 acquires the reflected spectral data 218 provided by the light sensor 119. This acquisition of the reflected spectral data 218 can be accomplished as fast as the computer 121 will allow, be synchronized to the timer for a preferred acquisition time of every 1 second, be synchronized to the rotary position sensor 142, and/or be synchronized to the orbital position sensor 143. The reflected spectral data 218 consist of a reflectance value for each of the plurality of pixel elements 205 of the detector array 203. Thus, the form of the reflected spectral data 218 will be a vector $R_{wbi}$ where i ranges from one to $N_{PE}$, where $N_{PE}$ represents the number of pixel elements 205. The preferred sampling time is to acquire a reflected spectral data 218 scan every 1 second. The preferred integration time is 15 milliseconds.

Next at box 607, the desired noise reduction technique or combination of techniques is applied to the reflected spectral data 218 to produce a reduced noise signal. At box 607, the desired noise reduction technique for metal polishing is to calculate the amplitude ratio of wavelength bands. The reflectance of a first preselected wavelength band 520 ($R_{wbx}$) is measured and the amplitude stored in memory. Similarly, the reflectance of the second preselected wavelength band 530 ($R_{wby}$) is measured and its amplitude stored in memory. The amplitude of the first preselected wavelength band ($R_{wb1}$) is divided by the amplitude of the second preselected wavelength band ($R_{wb2}$) to form a single value ratio that is one data entry vs. time and forms part of the endpoint signal (EPS) 124.

Next at box 609, the endpoint signal 124 is extracted from the noise-reduced signal produced in box 607. For metal polishing, the noise-reduced signal is also already the endpoint signal 124. For dielectric processing, the preferred endpoint signal is derived from fitting the reduced-noise signal from box 607 to a set of optical equations to determine the film stack thickness remaining, as one of ordinary skill in the art can accomplish. Such techniques are well known in the art. For example, see MacLeod, THIN FILM OPTICAL FILTERS (out of print), and Born et al., PRINCIPLES OF OPTICS: ELECTRONIC THEORY OF PROPAGATION, INTERFERENCE AND DIFFRACTION OF LIGHT, Cambridge University Press, 1998.

Next, at box 611, the endpoint signal 124 is examined using predetermined criteria to determine if the endpoint has been reached. The predetermined criteria are generally determined from empirical or experimental methods.

For metal polishing, a preferred endpoint signal 124 over time in exemplary form is shown in FIG. 5 by reference numeral 124. As seen, as the CMP process progresses, the EPS varies and shows distinct variation. The signal is first tested against threshold level 501. When it exceeds level 501 before the timer has timed out, the computer then compares the endpoint signal to level 507. If the endpoint signal is below 507 before the timer has timed out, then the transition to oxide has been detected. The computer then adds on a predetermined fixed amount of time and subsequently issues a stop polish command. If the timer times out before any of the threshold signals, then a stop polish command is issued. The threshold values are determined by polishing several wafers and determining at what values the transitions take place.

For dielectric polishing, a preferred endpoint signal results in a plot of remaining thickness vs. time. The signal is first tested against a minimum remaining thickness threshold level. If the signal is equal to or lower than the minimum thickness threshold before the timer has timed out, the computer then adds on a predetermined fixed amount of time and subsequently issues a stop polish command.

If the timer times out before the threshold signal, then a stop polish command is issued. The threshold value is determined by polishing several wafers, then measuring remaining thickness with industry-standard tools and selecting the minimum thickness threshold.

The specific criteria for any other metal/barrier/dielectric layer wafer system are determined by polishing sufficient numbers of test wafers, generally 2 to 10 and analyzing the reflected signal data 218, finding the best noise reduction technique, and then processing the resulting spectra on a spectra-by-spectra basis in time to generate a unique endpoint signal that may be analyzed by simple threshold analysis.

In many cases, the simplest approach works best. In the case of dielectric polishing or shallow trench isolation dielectric polishing, a more complicated approach will generally be warranted.

Next, at box 613, a determination is made as to whether or not the EPS satisfies the predetermined endpoint criteria. If so, then at box 615, the endpoint trigger signal 125 is transmitted to the CMP apparatus and the CMP process is stopped. If the EPS does not satisfy the predetermined endpoint criteria, the process goes to box 617 where the timer is tested to determine if a timeout has occurred. If no timeout has occurred, the process returns to box 605 where another reflected data spectrum is acquired. If the timer has timed out, the endpoint trigger signal 125 is transmitted to the CMP apparatus and the CMP process is stopped.

Additionally, it is desired that a CMP process should provide the same quality of polishing results across the entire wafer, a measure of the removal rate, and the same removal rate from wafer to wafer. In other words, the polish rate at the center of the wafer should be the same as at the edge of the wafer, and the results for a first wafer should be the same as the results for a second wafer. The present invention may be advantageously used to measure the quality and removal rate within a wafer, and the removal rate from wafer to wafer for the CMP process. For the data provided by an apparatus according to the present invention, the quality of the CMP process is defined as the standard deviation of the time to endpoint for all of the sample points divided by the mean of the set of sample points. In mathematical terms, the quality measure (designated by Q) is:

$$Q = \sigma/\bar{x} \qquad (1)$$

The calculation of Q may be accomplished by suitably programmed computer 121. The parameter of quality Q, although not useful for terminating the CMP process, is useful for determining whether or not the CMP process is effective.

The removal rate (RR) of the CMP process is defined as the known starting thickness of the film divided by the time to endpoint. The wafer-to-wafer removal rate is the standard deviation of the RR divided by the average RR from the set of wafers polished.

In accordance with a further aspect of the present invention, the endpoint extraction of step 609 and the application of a priori criteria of step 611 is further described. Once noise reduction techniques have been applied to the reflectance spectral data in step 607, the reflectance spectral data (as exemplified by graphs 240 and 241 of FIGS. 5A and 5B) can be analyzed to determine if the endpoint has been reached.

Figure 7:
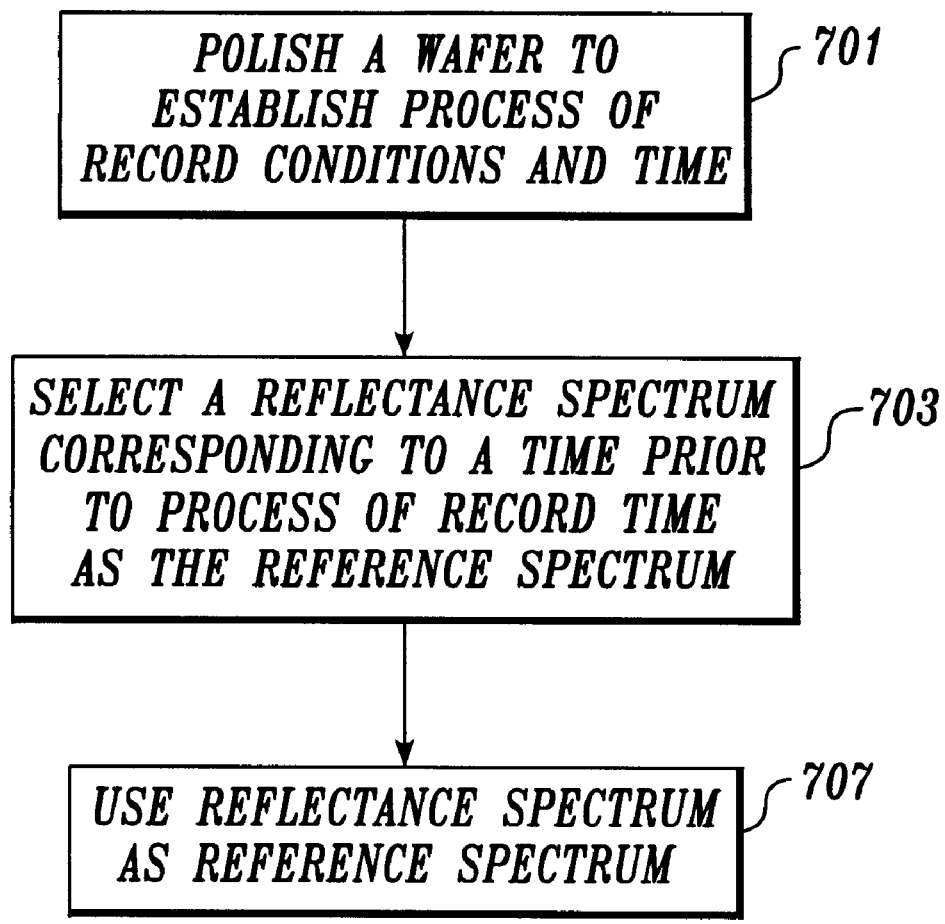
FIG. 7 is a flow diagram illustrating a method for obtaining a reference spectrum.

Typically, as noted above, reflectance data is measured as reflectance intensity vs. wavelength. In one preferred embodiment, a comparison is made between reflectance spectrum from the wafer being polished and the reflectance spectrum from a reference wafer (referred to as a "reference spectrum"). The method of determining the reference spectrum can be seen in FIG. 7. For endpoint generation while polishing a metal film, since the metal film is quite similar in reflectance spectrum from wafer to wafer, the reference spectrum may be taken from a reference wafer, or it may be taken each time a wafer is polished from the wafer itself, during the metal polishing phase before any clearing takes place.

At a first step 701, the reference spectrum is obtained by polishing a wafer to the process of record polish time and conditions while collecting the reflectance spectra vs. time from the wafer. At a second step 703, a reflectance spectrum at a selected time prior to the full polish time is then selected as the reference spectrum. One or more wafers may be used to establish the reference spectrum. The reference spectrum is obtained by polishing a wafer to the process of record polish time and conditions while collecting the reflectance spectra vs. time from the wafer. A reflectance spectrum at a selected time prior to the full polish time is then selected as the reference spectrum. One or more wafers may be used to establish the reference spectrum.

For wafers with a metal film to be polished, the reference time and corresponding reference spectrum are typically selected at a time that corresponds to stable polishing of the metal film before the onset of clearing of the metal film occurs. When clearing occurs, the reflected spectrum will be substantially different from the reference spectrum taken during the metal phase. In effect, for polishing of metal films, the method answers the question of when is the spectrum not the metal reference spectrum. Since the metal film is quite similar in reflectance spectrum from wafer to wafer, the reference spectrum may be taken from a reference wafer, or it may be taken each time a wafer is polished from the wafer itself, during the metal polishing phase before any clearing takes place.

Also please note that if it is desired to generate and endpoint on a barrier film between the metal film and a dielectric layer, the reference spectrum may be taken from the barrier layer with the appropriate reference wafer.

For dielectric film wafers, where the film reflectance changes during polishing, it is preferred to take a reference spectrum near the desired end point from a reference wafer. If it is desirable to know when, for example, half of the dielectric layer has been removed, a reference spectrum should be taken from the reference wafer that corresponds to half of the film being removed. The selection of the reference spectrum corresponds to the desired information from the film being polished. Alternatively, the reference spectrum may be the average of several reflectance spectra adjacent to the selected reflectance spectrum. This allows smoothing of the data and noise reduction.

Finally, at step 707, the captured reflectance spectrum is used as the reference spectrum for polishing of the production wafers. As will be seen below, the reference spectrum will play a crucial role in endpoint detection.

The foregoing description shows a preferred method of determining a reference spectrum. However, other methods may also be used to obtain the reference spectrum. The important consideration is that the reflectance spectrum of a wafer being polished at or near the desired endpoint must be captured for use as the reference spectrum.

Once the reference spectrum has been obtained, denoted mathematically as $R_{ref}(\lambda_i, t_{ref})$, the reference spectrum can be used as a benchmark for determining when endpoint has been reached.

The sum of all of the reflectance values between a starting and stopping wavelength in the reference signal may be divided into a single normalization value to calculate a normalization ratio. Each wavelength channel is then multiplied by this normalization ratio to generate a normalized reference spectrum. An identical calculation is performed on each of the measured reflectance spectra from production wafers before the comparison between the measured reflectance spectra and the reference spectra is calculated. This normalization process allows the levels of the signal to change without changing the relative spectral shape of the reflectance signal. This step may or may not be necessary to practice the invention, depending on the signal to noise ratio of the system. Generally if the calculated normalization ratio changes by more than 50% during the polishing of a wafer, the normalization procedure just described is preferred.

Figure 8:
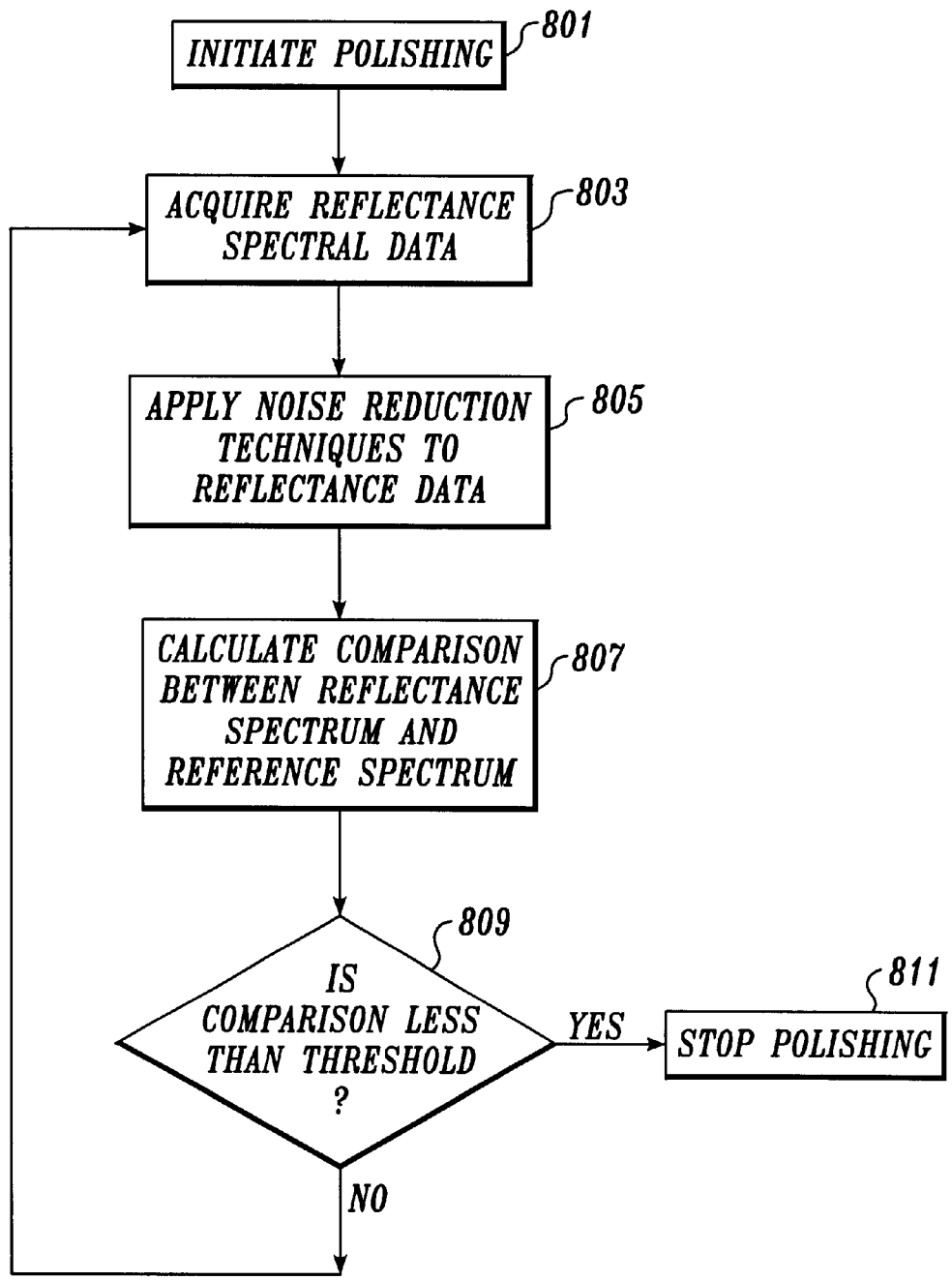
FIG. 8 is a flow diagram illustrating the method for determining endpoint for a dielectric layer.

Turning to FIG. 8, a flow diagram illustrating how the reference spectrum may be used is shown. Note that FIG. 8 is similar to FIG. 6 except that FIG. 6 includes a maximum polish time decision branch. For simplicity, FIG. 8 has eliminated this feature, but it can be appreciated that one of ordinary skill in the art can easily modify the method of FIG. 8 to include this feature.

First, at step 801, polishing of the production is initiated. Next, at step 803, the reflectance spectral data is acquired. The reflectance spectral data will typically take the form of graph 218a of FIG. 5A. The reflectance spectrum can be mathematically denoted as $R(\lambda_i, t_j)$, where t is the polish time, j is the time index, and i is the wavelength index.

Next, at step 805, noise reduction techniques described above in conjunction with step 607 of FIG. 6 may be applied. After noise reduction has been performed on the reflectance spectrum from the production wafer, a comparison value is calculated between the reflectance spectrum and the reference spectrum. The comparison value may be calculated by any method used to quantitatively determine the amount of variation between the reflectance spectrum and the reference spectrum.

For example, one method would be to calculate the sum of the squares of the difference of the reflectance from the reference spectrum and the reflectance spectrum using each wavelength in the spectra. Of course, other methods for determining the comparison value S(t) may be used. These other methods may include (i) dividing the reflectance spectrum with the reference spectrum or (ii) calculating a moment in spectrum space for each reference and reflectance spectrum and subtracting the moment.

Thus, while there are many methods for determining the comparison value S(t), it is preferred to have a calculation that yields a single number for each spectra so that an easy comparison with the predetermined threshold value is possible.

Next, at step 809, a determination is made as to whether or not the comparison value S(t) is less than a predetermined threshold value. If the comparison value S(t) is less than the predetermined threshold value, then at step 811, a stop polish command is issued and the polishing process ends. However, if the comparison value S(t) is not less than a predetermined threshold value, then polishing continues and further reflectance spectral data is gathered at step 803.

Various modifications may be made to the above basic method to improve robustness. For example, the comparison signal S(t) may be smoothed in time by simple averaging. Thus, only after several comparison signals have been calculated and averaged at step 807, will there be a comparison made at step 809 with the predetermined threshold level. Alternatively, the method may be modified to only stop polishing after the comparison signal S(t) is less than the predetermined threshold level for a minimum number of iterations before polishing is stopped. This technique eliminates the unwanted stopping of polishing due to anomalies in the reflectance spectrum detection system.

Yet another modification would be to include a timer that would limit the endpoint detection method until after a predetermined amount of time has elapsed from the start of polishing. By delaying the endpoint detection method, this would allow the polishing to stabilize when polishing, for example, copper films or transparent film stacks.

Figure 9:
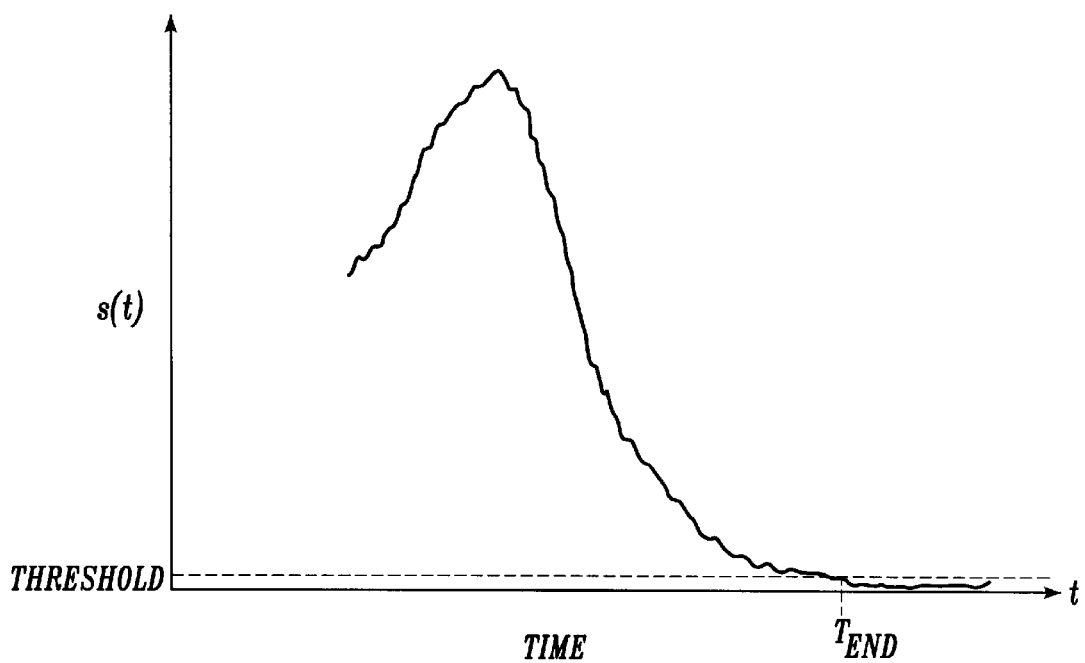
FIG. 9 is a graph showing a difference value S(t) versus polishing time for a typical wafer using the method of FIG. 8.

Turning next to FIG. 9, a graph illustrating the comparison value S(t) versus time is shown. This particular graph illustrates the polishing of a dielectric film. As seen in FIG. 9, the comparison value S(t) over time is shown. The comparison value S(t) tends to move towards a minimum as the polishing time increases. When the comparison value S(t) reaches the predetermined threshold value at time Tend, the polishing is stopped.

Figure 10:
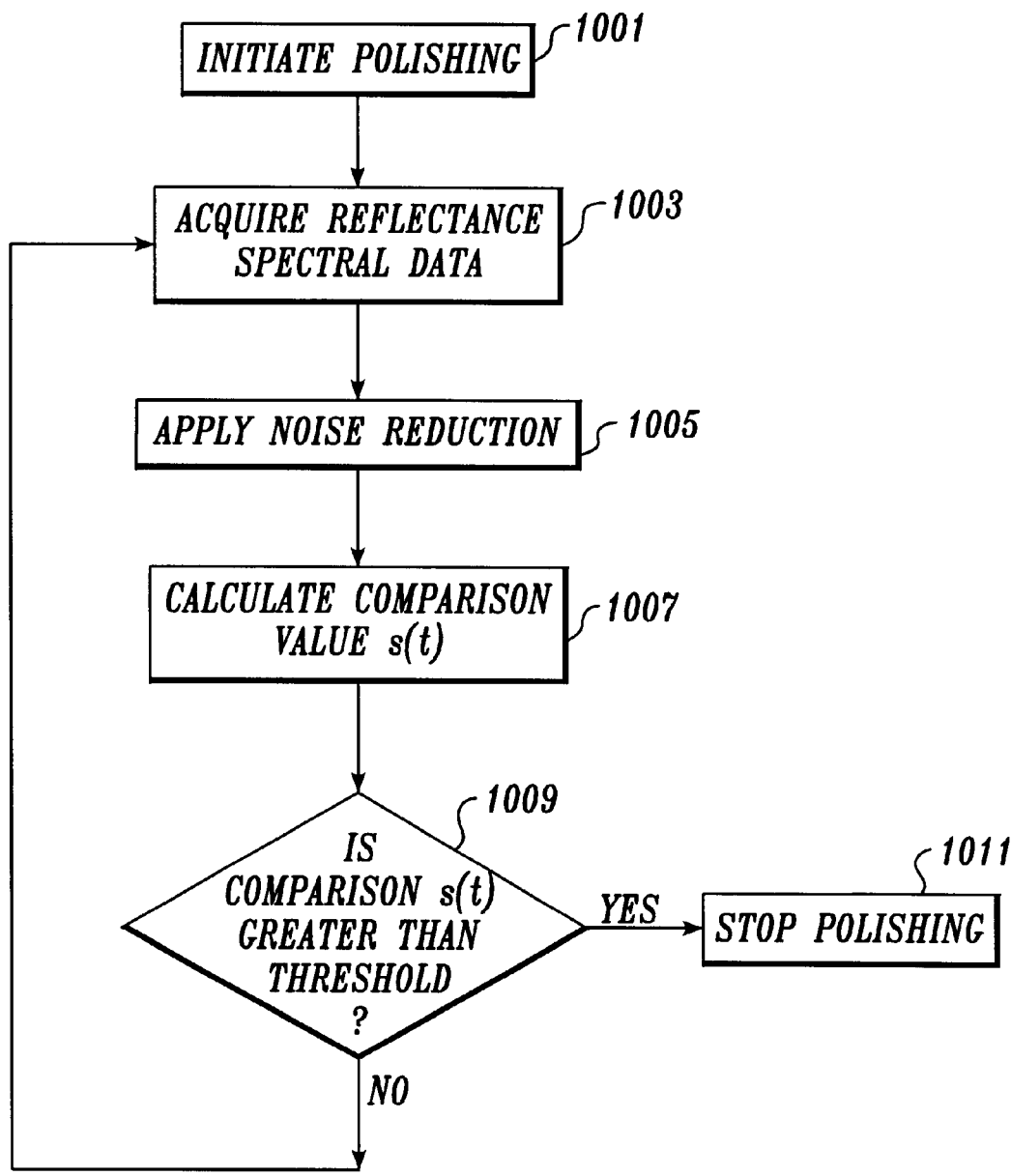
FIG. 10 is a flow diagram illustrating the method for determining endpoint for a metal layer.

FIG. 10 shows a flow diagram illustrating the method of the present invention when used for polishing metal films. The polishing of metal layers typically results in a reflectance spectrum that is stable until the metal layer begins to clear from the surface of the wafer. Once the metal layer begins to clear, the reflectance spectrum undergoes significant changes. This characteristic of polishing metal layers is accounted for in the method of FIG. 10.

FIG. 10 is substantially similar to FIG. 8. In particular, at step 1001, polishing of the wafer is initiated. Next, at step 1003, the reflectance data is gathered. Noise reduction is performed at step 1005 and the difference value is calculated at step 1007. At step 1009, if the comparison value S(t) is greater than a predetermined threshold value, then at step 1011, a stop polish command is issued and the polishing process ends. However, if the comparison value S(t) is not greater than the predetermined threshold value, then polishing continues and further reflectance spectral data is gathered at step 1003. Note that the same noise reduction techniques described above with respect to FIG. 8 may also be used in this case.

Figure 11:
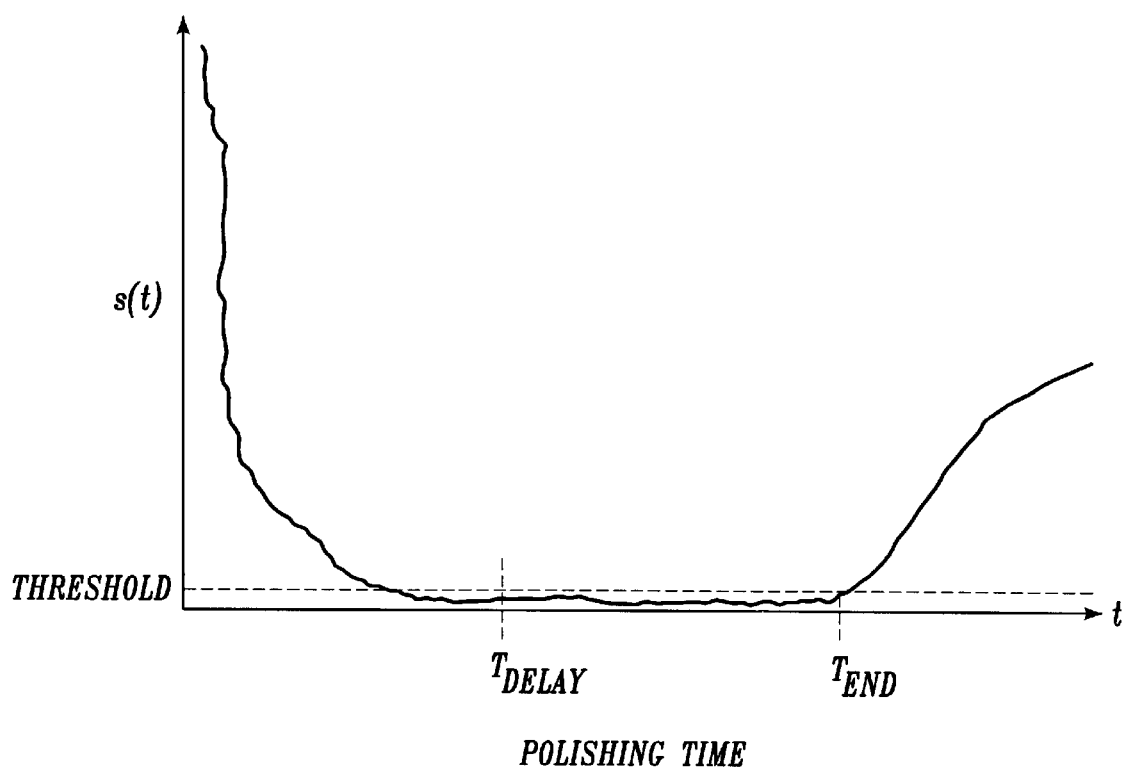
FIG. 11 is a graph showing a difference value S(t) versus polishing time for a typical wafer using the method of FIG. 10

Turning next to FIG. 11, an exemplary graph illustrating the comparison value S(t) versus time is shown for polishing metal layers. As seen, the comparison value S(t) over time is shown. The comparison value S(t) tends to stay at a low level until the endpoint is reached (the metal is cleared). At that point, the comparison value S(t) begins to increase. When the comparison value S(t) begins to move above a predetermined threshold value at time $T_{end}$, the polishing is stopped. Further, a time $T_{delay}$ may be used as a minimum polish time to eliminate transient polish start up effects. It may be realized to one practicing the art, that in addition to the comparison to a threshold value to generate a stop polishing command, a fixed amount of time or a percentage of time up to end point threshold may be added to the determined end point polishing time to achieve the desired results in polishing. For example, in dielectric polishing, the endpoint signal may be triggered as previously described, but the process engineer wants to add 2 seconds to the time to achieve the desired result.

The embodiments of the optical EPD system described above are illustrative of the principles of the present invention and are not intended to limit the invention to the particular embodiments described. For example, in light of the present disclosure, those skilled in the art can devise without undue experimentation embodiments using different light sources or spectrometers other than those described. Other embodiments of the present invention can be adapted for use in grinding and lapping systems other than the described semiconductor wafer CMP polishing applications. Accordingly, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for determining an endpoint during polishing of a semiconductor wafer, the method comprising:
   comparing a reflectance spectrum from said wafer during polishing to a reference spectrum obtained from a reference wafer different from said semiconductor wafer; and
   determining said endpoint when the result of said comparing meets a predetermined criteria.

2. The method of claim 1, wherein the step of comparing said reflectance spectrum is performed by calculating a difference value between the reflectance spectrum and the reference spectrum at a plurality of preselected wavelengths raising said difference values to an even power, and summing the resultant values.

3. The method of claim 1, wherein said predetermined criteria is: if the result of said comparing step is less than a threshold, and if the surface of said wafer is a dielectric, then endpoint has been reached.

4. The method of claim 1, wherein said predetermined criteria is: if the result of said comparing step is greater than a threshold value, and if the surface of said wafer is a metal, then endpoint has been reached.

5. The method of claim 1, wherein said step of comparing is performed after a predetermined time delay, said predetermined time delay shorter than an anticipated total polish time.

6. The method of claim 1, wherein the step of determining said endpoint includes an additional polish time added after said predetermined criteria is met.

7. An apparatus for use in a polishing system to generate an endpoint in the polishing of films on a semiconductor wafer comprising:
   a light source configured to illuminate said film;
   a light sensor configured to generate spectral reflectance data corresponding to the spectrum of reflected light from said film; and
   a computer coupled to said light sensor and configured to generate an endpoint calculated from said spectral reflectance data, said computer determining said endpoint by comparing said spectral reflectance data from said wafer surface during polishing to reference spectral reflectance data taken from a reference wafer different from said semiconductor wafer and determining said endpoint when the result of said comparing meets a predetermined criteria.

8. A method for detecting an endpoint during polishing of a wafer surface of a production wafer, the method comprising:

producing a reference spectrum corresponding to a spectrum of light reflected from the surface of a reference wafer different from said production wafer during polishing and at a time proximate to said endpoint, said reference wafer being of similar structure and composition as said production wafer;

providing a relative rotation between said wafer surface and a pad, the pad contacting the surface duling a polishing process of the wafer surface;

illuminating at least a portion of the surface with light having a predetermined spectrum while the wafer surface is being polished;

generating reflected spectrum data corresponding to a spectrum of light reflected from the wafer surface while the wafer surface is being polished;

comparing said reflected spectrum data with said reference spectrum and calculating a comparison value; and comparing said comparison value with a predetermined threshold value and if said comparison value meets predetermined criteria, indicating that said endpoint has been reached.

9. The method of claim 8 wherein said wafer surface is a dielectric and said endpoint is triggered when said comparison value is less than said predetermined threshold value.

10. The method of claim 8 wherein said wafer surface is a metal layer and said endpoint is triggered when said comparison value is greater than said predetermined threshold value.

11. The method of claim 8 wherein said comparison value is calculated as the sum of the squares of the difference between the reflected spectrum data and the reference spectrum.

12. The method of claim 8 wherein the step of producing said reference spectrum comprises the steps of:

polishing a test wafer, said test wafer of similar structure and composition as said production wafer, said test wafer being polished for a predetermined amount of time;

collecting a plurality of reflectance spectra from said test wafer at periodic time intervals during the polishing; and selecting one of said plurality of reflectance spectra as being said reference spectrum, said selection being based upon identifying the one of said plurality of reflectance spectra that corresponds to the polish time that is closest to said endpoint.

* * * * *